United States Patent [19]

Hopmayer et al.

[11] Patent Number: 4,493,018

[45] Date of Patent: Jan. 8, 1985

[54] CONDUCTOR SEPARATOR, WIRING HARNESS, AND RECTIFIER ASSEMBLY FOR AN ALTERNATOR INCLUDING SAME

[75] Inventors: Gary S. Hopmayer, Wilmette; Charles Barone, Norwood Park, both of Ill.

[73] Assignee: Mega International, Inc., Des Plaines, Ill.

[21] Appl. No.: 430,865

[22] Filed: Sep. 30, 1982

[51] Int. Cl.³ .......................... H02M 1/00; H05K 7/02
[52] U.S. Cl. ............................... 363/145; 24/129 R; 174/72 A; 174/175
[58] Field of Search ............ 174/72 A, 72 TR, 138 F, 174/175; 310/68 R, 68 D; 339/148, 198 K; 361/428; 363/145; 24/129 R, 129 D, 335, 336, 339; 248/68 R

[56] References Cited

U.S. PATENT DOCUMENTS

| 2,072,635 | 3/1937 | Helgason et al. | 174/138 F |
| 2,633,481 | 3/1953 | Meeks | 174/138 F X |
| 3,382,316 | 5/1968 | Weiner | 174/72 A |

FOREIGN PATENT DOCUMENTS

| 52701 | 12/1966 | Fed. Rep. of Germany | 174/72 A |
| 1021496 | 3/1966 | United Kingdom | 174/175 |
| 1279522 | 6/1972 | United Kingdom | 248/68 R |

Primary Examiner—Laramie E. Askin
Attorney, Agent, or Firm—Silverman, Cass & Singer, Ltd.

[57] ABSTRACT

A planar, rectilinear separator member is used to form a wiring harness for a rectifier assembly of an automotive alternator. The member is provided with pairs of upstanding posts spaced apart just less than the diameter of a conductor. A conductor is engaged and retained between two pairs of such posts. The member is further provided with a passageway located between the two pair of posts for the conductor and a "U" shaped terminal portion of the conductor passes through and extends beyond the passageway when the conductor is retained between the pair of posts. The wiring harness is formed of three conductors and one member, there being two pairs of posts and a centrally located passageway for each conductor. The ends of the conductors extend beyond the edges of the member different lengths and are connected to rectifier diodes carried on two rectifier plates. The rectifier assembly is formed of the two plates and the wiring harness with the member being located substantially between adjacent ends of the plates.

14 Claims, 5 Drawing Figures

U.S. Patent   Jan. 8, 1985   4,493,018
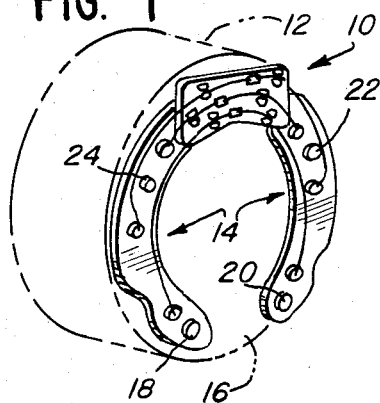
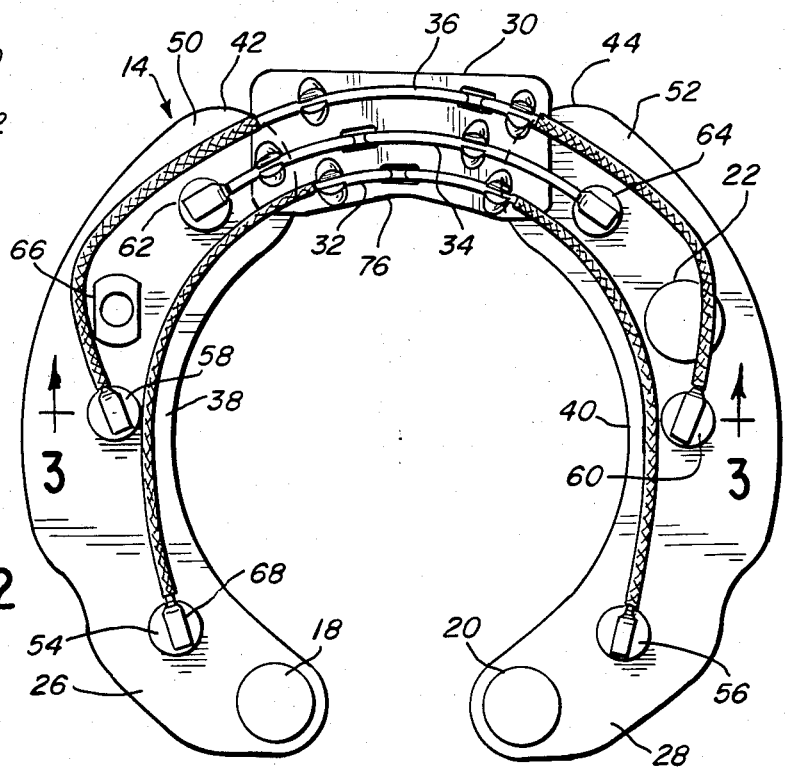
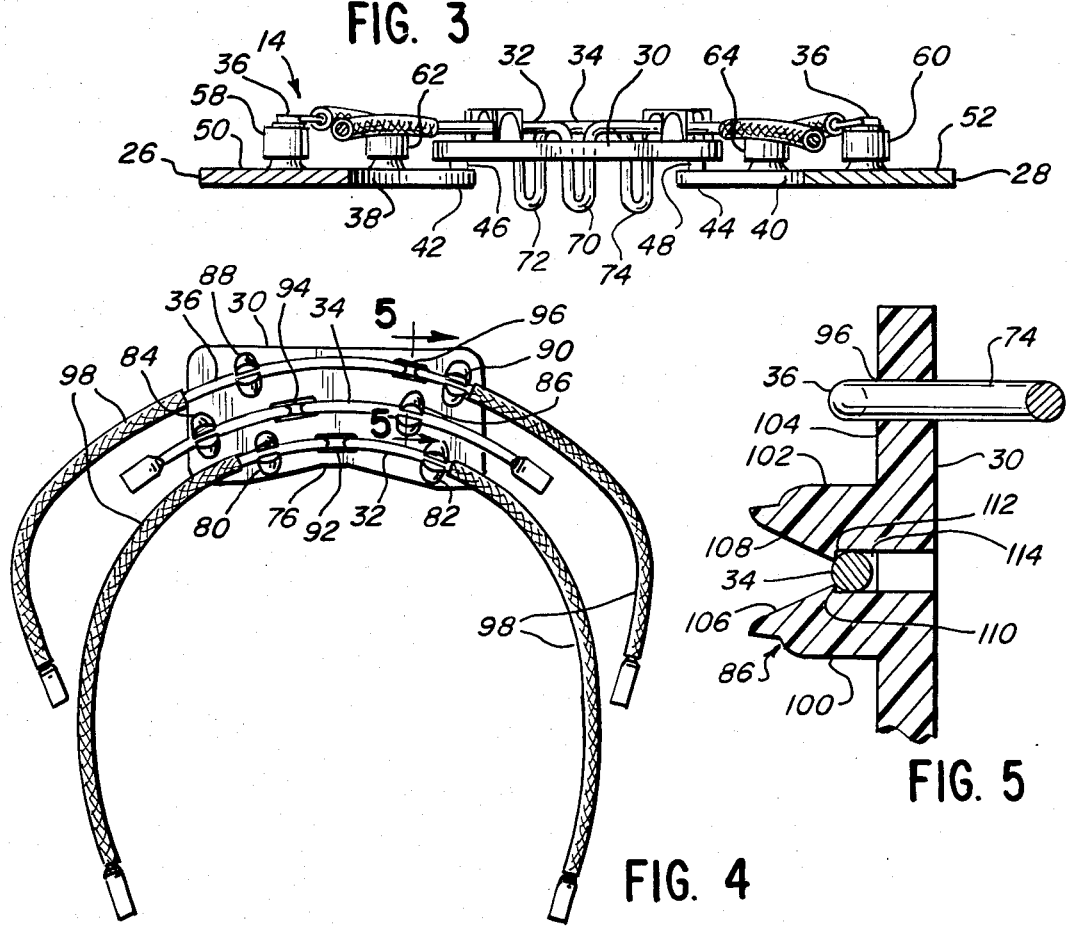

CONDUCTOR SEPARATOR, WIRING HARNESS, AND RECTIFIER ASSEMBLY FOR AN ALTERNATOR INCLUDING SAME

BACKGROUND OF THE INVENTION

This invention relates generally to electrical power supplying alternators such as are used in automobiles and, in particular, relates to a rectifier assembly for such an alternator.

Alternators are used in automotive applications such as cars, trucks, etc. for producing electrical power from the rotation of the drive shaft of the internal combustion engine of the vehicle.

The alternator generally is cylindrical and carries on one end a rectifier assembly. This assembly is comprised of rectifier diodes, heat sink plates and connecting wires. The assembly is removably bolted on the end of the alternator for replacement of the rectifier diodes if they should become damaged or fail to operate properly.

The rectifier assembly is required to rectify the alternating current electrical power produced by the alternator.

In one prior rectifier assembly disclosed in U.S. Pat. No. 3,382,316 to Weiner, three insulated connecting wires are cut to length, have terminals mounted on their bared ends and have "U" shaped terminal portions formed centrally of their lengths. The three wires then are mounted in a mold and a rigid plastic circular casing is molded around the central portions of the wires with the terminal portions protruding through the casing. The terminals of the wires then are connected to the diodes carried on two rectifier plates. The circular casing rigidly mounts the wires in spaced position relative to one another and provides a support bridge between the rectifier plates so that the wires, casing and plates form a rigid unitary assembly.

The assembly disclosed in the referenced patent is mounted on the end of the alternator by bolts passing through the plates and electrical connection to the alternator windings is by the "U" shaped terminal portions protruding through the casing.

Other types of more complicated rectifier assemblies for alternators are known with several being disclosed in U.S. Pat. Nos. 4,189,653; 4,103,193; 4,065,686; 4,059,778; and 3,831,047.

All of these rectifier assemblies are expensive to assemble in that they require manual operations. In the assembly disclosed in the patent to Weiner, several operations must be performed on the wires prior to their being encased in the molded plastic casing. Further, care must be exercised in inserting the wires properly in the mold so that they are properly aligned with respect to their spacings and the relative placements of their ends and terminal portions. The wires must also be of the type carrying their own insulation because the molded casing is insufficient to insure proper insulation between the conductors of the wires.

A simplified structure that both mounts the conductors and provides rigidity for the rectifier assembly would reduce the cost of such a rectifier assembly, and would provide a low cost alternative for other types of rectifier assemblies. Also, more convenient and economical repair and replacement of parts of the wiring harness assembly embodying the invention can be realized.

SUMMARY OF THE INVENTION

In accordance with the invention, a conductor separator member is provided that is planar and rectangular. The member includes at least a pair of conductor retaining means for retaining a conductor on the member. The member further includes a terminal passageway through the member located between the pair of retaining means.

The member and at least one conductor is assembled together to form a wiring harness. The conductor is engaged and retained in the at least one pair of retaining means and a terminal portion of the conductor passes through and extends beyond the passageway.

A rectifier assembly is formed of a wiring harness and two planar rectifier plates, which carry rectifier diodes. The plates are arranged in a plane adjacent one another. The wiring harness is overlaid on the plates with the member bridging across adjacent ends of the plates and the ends of the conductor extend over and are connected to the rectifier diodes on the two plates.

The member is made by such as injection molding from synthetic resin material and may provide a plurality of pairs of retaining means and passageways located therebetween.

The retaining means each may be formed of two posts projecting upwardly from the member, the posts being spaced apart a distance just less than the diameter of the conductor, and the conductor being retained between the posts.

The posts may have facing surfaces that are sloped opening to the top of the posts, the surfaces terminating inwardly in flanges positively retaining the conductor between the posts and below the flanges.

BRIEF DESCRIPTION OF THE DRAWING

FIG. 1 is a perspective view of a diagrammatically illustrated alternator carrying a rectifier assembly of the invention;

FIG. 2 is a plan view of a rectifier assembly of the invention;

FIG. 3 is a sectional view of the assembly of FIG. 2 taken along the line 3—3 in the direction indicated by the arrows;

FIG. 4 is a plan view of a wiring harness of the invention; and

FIG. 5 is a partial sectional view of the wiring harness of FIG. 4 taken along the line 5—5 in the direction indicated by the arrows.

DESCRIPTION OF THE PREFERRED EMBODIMENT

In FIG. 1, an alternator is indicated generally by the reference character 10. Alternator 10 comprises a body 12 and a rectifier assembly 14 mounted on one end 16 thereof. Assembly 14 is mounted in alternator body 12 by four bolts 18, 20, 22 and 24.

In FIGS. 2 and 3, assembly 14 comprises two rectifier plates 26 and 28, a conductor separator member 30 and three conductors 32, 34 and 36. Plates 26 and 28 are generally planar and arcuate in plan view, and have concave edges 38 and 40 facing one another. At adjacent ends 42 and 44, plates 26 and 28 are formed by such as bending to provide upstanding standards 46 and 48 for spacing member 30 from their top side surfaces 50 and 52. This spaces the conductors retained in the separator member the proper distance above the plates for connection to the diodes.

Plates 26 and 28 carry or have fixed thereon six rectifier diodes 54, 56, 58, 60, 62 and 64, arranged three diodes per plate. Plates 26 and 28 also carry bolts 18, 20 and 22 with bolt 22 being electrically connected to plate 28 by such as soldering. Plate 26 carries an insulating nut 66 for receiving bolt 24 therein electrically insulated from plate 26.

Plates 26 and 28 are made from any sheet metal desired such as steel or aluminum so that they may serve as heat sinks and electrical conductors for the diodes carried thereon. Plates 26 and 28 are shaped in plan view to provide clearance for any protrusions from end 16 of alternator body 12 and thus may be shaped differently than as shown.

Diodes 54, 56, 58, 60, 62 and 64 are connected together in pairs by the conductors 32, 34 and 36 to form three full wave rectifiers. The ends of the conductors such as the end 68 of conductor 32 are flattened and electrically connected to the diodes, such as 54, by such as soldering. Other methods of connection are possible. Alternator 10 is a three phase generator and thus there is one full wave rectifier for each phase produced by the alternator.

Conductors 32, 34 and 36 are bare, 14 gauge, tinned copper wires of different lengths. Conductor 32 is the longest, 34 is the shortest and 36 is of intermediate length. See also FIG. 4. Conductors 32, 34 and 36 are formed to have arcuate shapes conforming to the locations of the diodes they are connected to, while passing over member 30 bridging plates 26 and 28.

Conductors 32, 34 and 36 are bent to provide "U" shaped formations, respectively, 70, 72 and 74 centrally of their lengths. These "U" shaped formations provide terminal portions for connecting the conductors, and thereby the diodes, to the windings of the alternator 10. The lengths and configurations of conductors 32, 34 and 36 and the location of the diodes on the plates 26 and 28 may be modified as desired so long as each conductor connects together a pair of diodes, one on each plate.

Member 30, see FIGS. 2, 3 and 4, is a generally planar element that is generally rectangularly shaped but is provided with a recess 76 to provide clearance for protrusions from side 16 of alternator 10. Member 30 is formed of any insulator material desired and in the preferred embodiment is injection molded of synthetic resin material separate from the conductors 32, 34 and 36. The more rigid the material, the more rigid the assembly.

Member 30 is provided with a plurality of conductor retaining means 80, 82, 84, 86, 88 and 90, and a plurality of terminal passageways 92, 94 and 96. In the preferred embodiment illustrated there are two retaining means for each conductor with a terminal passageway located between the two retaining means for each conductor. Other arrangements are possible, such as there being two retaining means for one conductor and one retaining means for each of the other two conductors; location of the terminal passageways then may be as desired. The use of two retaining means and a centrally located terminal passageway as illustrated with 14 gauge conductor wire provides substantial rigidity for the rectifier assembly while it is separate from alternator 10 and being mounted thereon.

Thus, in the preferred embodiment, conductor 32 is engaged and fixedly mounted on member 30 by retaining means 80 and 82 and its terminal portion 70 extends through passageway 92; conductor 34 is engaged in retaining means 84 and 86 and its terminal portion 72 extends through passageway 94; and conductor 36 is engaged in retaining means 88 and 90 and its terminal portion 74 extends through passageway 96.

Conductors 32 and 36 carry separate insulator sleeves 98 that are slipped over the ends of the conductors, preferably after the conductors are installed on member 30.

In FIG. 5, passageway 96, like the other passageways, extends through member 30 and terminal portion 74 of conductor 36 passes through and extends beyond passageway 96 for connecting to the alternator winding.

Retaining means 86 comprise two posts 100 and 102 integral with and projecting from the top side surface 104 of member 30. Posts 100 and 102 are spaced apart a distance D that is slightly less than the diameter of conductor 34. For 14 gauge wire, the distance D will be just less than about 0.064 inch. Posts 100 and 102 are provided with sloped receiving surfaces 106 and 108 which face one another and open to the top of the posts. Surfaces 106 and 108 inwardly terminate in flanges 110 and 112 that positively hold the conductor 34 between the posts 100 and 102.

During installation of the conductor in the retaining means, the conductor 34 is placed on the sloped surfaces 106 and 108 and is pressed past the flanges 110 and 112 into the central space 114 where conductor 34 is positively held. The material of posts 100 and 102, being the same resin material as member 30, provides sufficient resiliency for posts 100 and 102 to flex outwardly and return as conductor 34 is moved into central space 114 in a snap or friction fit.

Retaining means formed other than as illustrated and described are possible. For example, the retaining means may be separate from member 30 and not integrally formed therewith. Posts 100 and 102 may be formed without flanges 110 and 112 and with greater or lesser sloped surfaces 106 and 108. What is important about the retaining means is that each means provide positive retention of the conductor to the member 30 with a simple installation movement and low force, i.e., a friction fit.

Assembly 14 may be assembled by installing the diodes on each plate and placing the plates 26 and 28 on a jig. The conductors 32, 34 and 36 are separately cut to length, have their terminal portions formed and are installed on member 30. The wiring harness formed by the conductors 32, 34 and 36 and member 30 then is overlaid on the plates in the jig and the conductors are soldered to the diodes. The finished assembly is removed from the jig and the next two plates and wiring harness are placed in the jig, etc.

Referring again to FIGS. 1 and 2, in the finished rectifier assembly 14, separator member 30 is located substantially between the adjacent ends 42 and 44 of the plates 26 and 28, but in a plane parallel to and above the plane of the plates 26 and 28.

The invention may be practiced other than as described in the preferred embodiment, such as, by modification of dimensions of components, including the conductor wire materials. It is to be understood that such modifications and variations of the rectifier assembly are within the scope of the appended claims construed in light of the specification.

What is claimed is:

1. A rectifier assembly for use with an electrical power alternator, comprising:

two planar rectifier plates arranged adjacent one another in a plane, the plates each carrying rectifier diodes for rectifying the electrical power of the alternator;

a conductor separator member arranged substantially between adjacent ends of the two plates, the member being generally planar and including at least one pair of upstanding means for retaining a conductor therein and at least one terminal passageway located between said pair of retaining means; and at least one conductor having two opposed ends and a terminal portion located therebetween, one end of the conductor being connected to a rectifier diode on one plate and the other end of the conductor being connected to a rectifier diode on the other plate, the conductor being engaged and retained in the pair of retaining means and the terminal portion passing through and extending beyond the passageway in said member.

2. The assembly of claim 1 in which there are three pairs of rectifier diodes, one of each diode pair being located on each plate, there are three conductors of varying lengths connecting the ones of each diode pair to the others of each diode pair, and there are three pair of retaining means and three openings.

3. The assembly of claim 1 in which each retaining means includes a pair of upstanding posts located on a top side surface of the member, the posts being spaced apart a distance slightly less than the diameter of the conductor and the conductor being retained between said posts.

4. The assembly of claim 3 in which the posts have surfaces facing one another that are sloped opening to the top of the posts, and the surfaces terminate inwardly in flanges.

5. The assembly of claim 1 in which the conductor is bare and there are separate insulators fitted over the ends of the bare conductor.

6. The assembly of claim 1 in which the member is made of synthetic resin material.

7. The assembly of claim 1 in which the plates include upstanding standards at their adjacent ends and the member rests on said standards in a plane parallel to and above the plane of said plates.

8. A wiring harness for use in a rectifier assembly of an alternator, comprising:

a conductor separator member that is generally planar and includes at least one pair of integral retaining means for retaining a conductor therein, and one terminal passageway located between said pair of retaining means, said member being made of synthetic resin material; and at least one conductor having two opposed ends and a terminal portion located therebetween, the conductor being engaged and retained in said pair of retaining means with said terminal portion passing through and extending beyond said passageway and the ends of said conductor extending beyond said member.

9. The wiring harness of claim 8 in which there are three pairs of retaining means with a passageway located between each pair and there are three of said conductors, one conductor being engaged in each pair of retaining means and the terminal portion of each conductor passing through and extending beyond the passageway located between the pair of retaining means.

10. The wiring harness of claim 8 in which each retaining means includes a pair of upstanding posts located on a top side surface of the member, the posts being spaced apart a distance slightly less than the diameter of the conductor and the conductor being retained between said posts.

11. The wiring harness of claim 10 in which the posts have surfaces facing one another that are sloped opening to the top of the posts and the surfaces terminate inwardly in flanges.

12. The wiring harness of claim 8 in which said conductor is bare and separate insulator sleeves are fitted over the ends of the bare conductor.

13. A wiring harness for use in a rectifier assembly of an alternator, comprising:

at least one conductor having two opposed ends and a terminal portion located therebetween, a conductor separator member that is generally planar and includes at least one pair of retaining means for retaining said conductor therein, each retaining means including a pair of upstanding posts located on a top side surface of the member, the posts being spaced apart a distance slightly less than the diameter of the conductor, and one terminal passageway located between said pair of retaining means; and the conductor being engaged and retained in said pair of retaining means with said terminal portion passing through and extending beyond said passageway and the ends of said conductor extending beyond said member.

14. A wiring harness for use in a rectifier assembly of an alternator, comprising:

a conductor separator member that is generally planar and includes at least one pair of retaining means for retaining a conductor therein, and one terminal passageway located between said pair of retaining means; and at least one conductor having two opposed ends and a terminal portion located therebetween, the conductor being engaged and retained in said pair of retaining means with said terminal portion passing through and extending beyond said passageway and the ends of said conductor extending beyond said member, said conductor being bare and separate insulator sleeves being fitted over the ends of the bare conductor.

* * * * *